(12) United States Patent  
Heubner et al.

(10) Patent No.: US 9,531,039 B2
(45) Date of Patent: Dec. 27, 2016

(54) BATTERY MANAGEMENT SYSTEM FOR A BATTERY CELL WITH A PRESSURE-SENSITIVE FILM SENSOR

(71) Applicants: Robert Bosch GmbH, Stuttgart (DE); Samsung SDI Co., Ltd., Yongin-si, Gyeonggi-do (KR)

(72) Inventors: Anne Heubner, Stuttgart (DE); Remigius Has, Grafenau-Daetzingen (DE); Andreas Ruehle, Stuttgart (DE); Fabian Henrici, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 557 days.

(21) Appl. No.: 13/904,591

(22) Filed: May 29, 2013

(65) Prior Publication Data
US 2013/0323554 A1 Dec. 5, 2013

(30) Foreign Application Priority Data

Jun. 1, 2012 (DE) .......................... 10 2012 209 271

(51) Int. Cl.
*H01M 10/48* (2006.01)
*H01M 2/34* (2006.01)
(Continued)

(52) U.S. Cl.
CPC .............. *H01M 10/48* (2013.01); *H01M 2/345* (2013.01); *H01M 10/0587* (2013.01);
(Continued)

(58) Field of Classification Search
None
See application file for complete search history.

(56) References Cited

U.S. PATENT DOCUMENTS

| | | | | |
|---|---|---|---|---|
| 2006/0040181 A1* | 2/2006 | Kim | ........................ | H01M 2/30 429/211 |
| 2009/0053586 A1* | 2/2009 | Fredriksson | ............ | H01M 2/08 429/57 |

(Continued)

FOREIGN PATENT DOCUMENTS

DE      10 2009 028 986 A1      3/2011

*Primary Examiner* — Scott J Chmielecki
(74) *Attorney, Agent, or Firm* — Maginot, Moore & Beck LLP

(57) ABSTRACT

A battery management system is configured for use with a battery having at least one battery cell with a cell housing and an electrode winding arranged inside the cell housing. The battery management system includes a battery state detection mechanism. The electrode winding is covered at least partially by a pressure-sensitive film sensor. The battery state detection mechanism is configured to read in a measured value, provided by the pressure-sensitive film sensor, or a variable derived from this measured value. The battery state detection mechanism uses the measured value/variable as an evaluation parameter to determine the battery state. The battery state detection mechanism is configured to determine a swelling force from swelling of the electrode winding due to the state of charge thereof by using the measured value/variable. The swelling force is used to further determine the state of charge or state of health of the battery cell.

11 Claims, 2 Drawing Sheets

(51) Int. Cl.
*H01M 10/44* (2006.01)
*H01M 10/0587* (2010.01)
H01M 10/052 (2010.01)
H01M 10/42 (2006.01)
G01R 31/36 (2006.01)

(52) U.S. Cl.
CPC ....... *H01M 10/445* (2013.01); *G01R 31/3606* (2013.01); *H01M 10/052* (2013.01); *H01M 2010/4271* (2013.01); *H01M 2200/20* (2013.01); *Y02T 10/7011* (2013.01)

(56) References Cited

U.S. PATENT DOCUMENTS

| | | | |
|---|---|---|---|
| 2009/0214935 A1* | 8/2009 | Berman | 429/61 |
| 2010/0285338 A1* | 11/2010 | Christensen | H01M 4/134 429/50 |
| 2012/0003510 A1* | 1/2012 | Eisenhour | 429/50 |
| 2012/0052359 A1* | 3/2012 | Yoshitake | H01M 2/1077 429/120 |

* cited by examiner

BATTERY MANAGEMENT SYSTEM FOR A BATTERY CELL WITH A PRESSURE-SENSITIVE FILM SENSOR

This application claims priority under 35 U.S.C. §119 to patent application no. DE 10 2012 209 271.4, filed on Jun. 1, 2012 in Germany, the disclosure of which is incorporated herein by reference in its entirety.

The present disclosure relates to a battery management system for a battery which contains a corresponding battery cell. In addition, a hybrid and electric motor vehicle with such a battery management system is made available.

BACKGROUND

It is apparent that in future new battery systems which have to meet very stringent requirements in terms of reliability, safety, efficiency and service life will be used both for stationary applications, such as wind power plants, in motor vehicles which are configured as hybrid or electric motor vehicles, and in electronic devices such as laptops or mobile phones.

In vehicles with an at least partially electric drive, batteries are used to store the electrical energy for the electric motor which assists the drive or serves as a drive. In vehicles of the latest generation, for example so-called lithium-ion battery cells are used in this context. Said cells are characterized, inter alia, by high energy densities and extremely low self-discharging. Lithium-ion battery cells have a positive and a negative electrode at which lithium ions can reversibly migrate in (intercalation) or migrate out again (deintercalation). As a rule, a plurality of battery cells are combined to form a battery module, and then a plurality of battery modules are combined to form a battery by parallel or series connection. An important requirement here is an effective battery management system which monitors the function of the individual cells of the battery and controls the charging process thereof. In this way, for example defective cells can be switched off and/or bypassed and state messages relating to the state of charge can be output.

Lithium-ion battery cells according to the prior art have, as a rule, a metallic cell housing in which an electrode winding is arranged. The electrode winding comprises two metallic substrates which are coated with the active cathode material or anode material. Between the two substrates there is a separator. The cell is connected electrically via the upper side and underside of the electrode winding.

In addition it is known that lithium-ion battery cells are subjected to considerable expansion of volume and contraction of volume due to the different states of charge; that is to say the electrode windings of the cells expand during charging and contract again during discharging. These changes in volume are caused by the processes of lithium ions migrating in and out in the electrode. Given corresponding deformation of the cell, this change in volume would be extended further outward beyond the casing of the battery cell and would lead to a change in the geometric dimensions of the battery. For this reason, in lithium-ion battery cells according to the prior art the housing is composed of a rigid metallic body. DE 10 2009 028 986 A1 discloses a method and a device by means of which a premature wear or ageing process of a lithium-ion battery, due to the expansion of the volume owing to the state of charge of the battery cells of the lithium-ion battery, can be prevented and a sufficiently low internal resistance can be ensured in a simple manner. For this purpose, a counter-pressure is applied to the lithium-ion battery by the device as a function of the volume of said battery. However, to do this the pressure originating from the battery cells has to be determined very precisely as a function of the battery volume.

A disadvantage with the solutions according to the prior art is, inter alia, that the positioning of a pressure sensor in the wall of the housing or on the outside of the housing cannot provide any direct information about the change in volume of the electrode winding. Furthermore, at present no prior-art methods or devices are known by means of which the state of health or the precise state of charge can be inferred directly from the pressure originating from the battery cells of a lithium-ion battery or the force which constitutes the pressure.

SUMMARY

According to the disclosure, a battery management system of a battery, which has at least one battery cell having a cell housing and an electrode winding which is arranged inside the cell housing, is made available. In addition, the battery management system comprises a battery state detection means. The electrode winding of the battery cell is covered at least in certain areas by a pressure-sensitive film sensor, and the battery state detection means is configured to read in a measured value, made available by the pressure-sensitive film sensor, or a variable derived from this measured value and to use it as an evaluation parameter for determining the battery state. The battery state detection means is configured to determine a swelling force F from the swelling of the electrode winding owing to the state of charge (SOC) thereof by using the measured value, made available by the pressure-sensitive film sensor, or a variable derived from this measured value, which swelling force F is used for the further determination of the state of charge (SOC) or state of health (SOH).

The advantage of such a battery management system of a battery is the possibility of detecting the state of health (SOH) or the state of charge (SOC) of a battery cell easily and precisely by means of the pressure-sensitive film sensor, and instantaneously and without taking into account a history of measured values which are to be recorded, or have previously been recorded with the same battery cell. It is also possible to combine the method of determining the state of health (SOH) by means of the battery management system according to the disclosure with existing methods for determining said state of health (SOH) such as, for example, a calculation of the state of charge (SOC) and state of health (SOH) which is associated with the temperature and the voltage of the battery cell. By storing measured values or measurement series and characteristic curve diagrams which are characteristic of the battery cells and have been previously determined with reference battery cells and by comparing these measured values with the measured variables at the battery cell to be measured it is also possible to adapt the determination of the state of health (SOH) very precisely to the respectively present battery cell type.

The pressure-sensitive film sensor preferably determines the maximum swelling force $F_{max}$ whenever the battery cell is completely charged (F at $SOC_{max}$), and/or determines the minimum swelling force $F_{min}$ whenever the battery cell is completely discharged (F at $SOC_{min}$) from the maximum or minimum swelling of the electrode winding, and makes this available for the evaluation of the battery state detection means.

In one preferred embodiment, the battery state detection means is configured to calculate a mean value of the swelling force $\overline{F}$ from the values $F_{min}$ and $F_{max}$ according to the rule $\overline{F}=F_{max}-\frac{1}{2}\Delta F$, where $\Delta F=F_{max}-F_{min}$. The mean value of the swelling force $\overline{F}$ is also particularly well suited for estimating the state of health since the so-called interval width $\Delta F=F_{max}-F_{min}$ is taken into account in it.

The battery state detection means is preferably configured to compare the calculated mean value $\overline{F}$ with measured values $\overline{F_{meas}}$ corresponding to the battery cell type and stored in the battery management system, of the respective charging/discharging cycle and to infer the state of health (SOH) of the battery cell from the result of this comparison. By comparing the mean value of the swelling force $\overline{F}$ with the corresponding measured value $\overline{F_{meas}}$ for the battery cell type, very precise estimation of the state of health of a battery cell is possible. In particular, since the charging/discharging cycle which the battery cell is in is taken into account in the estimation. The absolute value of the expansion of the battery cell is not dependent here exclusively on the state of charge (SOC) of the battery cell, that is to say the swelling force itself, but is also dependent on the charging/discharging cycle or the state of health which the battery cell is in. Considered in precise terms, a force which increases cyclically on a calendar basis with age is superimposed on the swelling force. Conclusions about the state of health (SOH) of the battery cell can be drawn well from this superimposed force.

In one preferred embodiment, the battery state detection means is also configured to compare the maximum swelling force $F_{max}$ and/or the minimum swelling force $F_{min}$ and/or $\Delta F$ with measured values $F_{min,meas}$, $F_{max,meas}$ and $\Delta F_{meas}$, corresponding to the battery cell type and to these values themselves and stored in the battery management system, of the respective charging/discharging cycle and to take into account the result of this comparison in the calculation of the state of health (SOH) of the battery cell. In this way, abnormalities of the battery cell whose state of health is to be determined can be detected. If the minimum or maximum swelling force values ($F_{min}$ and $F_{max}$) deviate from the minimum or maximum swelling force values ($F_{min,meas}$ and $F_{max,meas}$) stored for the battery cell type, owing, for example, to a construction peculiarity of the battery cell under consideration, this deviation can be detected and taken into account in the determination of the ageing.

The measured values are preferably stored in the form of a linear characteristic curve extracted from measurement series for the respectively present battery cell type, inside the battery management system. Furthermore, it is preferred if the measured values are stored in the form of characteristic curve diagrams, wherein each characteristic curve diagram makes available the swelling force measured values in each charging/charging cycle for a specific battery cell type.

In one preferred embodiment, the battery state detection means is also configured to detect, from the comparison of the measured swelling force F with the measured value $F_{min,meas}$, stored in the battery management system, of the respective charging/discharging cycle, whether a battery cell is in the opened state or is leaking. If the measured swelling force F is far below the minimum swelling force $F_{min,meas}$ (F at $SOC_{min}$) which is characteristic of the respective charging/discharging cycle, that is to say $F \ll F_{min,meas}$ of the respective charging/discharging cycle, this indicates a leaking or an opened battery cell.

The battery management system is preferably configured to generate a warning signal in the case of an opened or leaking battery cell and to transmit said warning signal to a central control unit. If the battery management system is installed, for example, in an electric or hybrid vehicle, a warning signal can be generated in the case of an opened or leaking battery cell and said warning signal can be transmitted to the central vehicle control unit. It is therefore possible for the driver of the vehicle to be warned of a failure or a hazard possibly arising from the opened or leaking battery cell.

In one preferred embodiment, the battery state detection means is configured to estimate the state of charge (SOC) of the battery cell by means of the rule $SOC=(F-F_{min})/(F_{max}-F_{min})$. With this rule it becomes possible to infer the state of charge (SOC) of the battery cell exclusively by using instantaneously measured swelling force values. For this purpose, the difference between the currently measured swelling force F and the minimum swelling force $F_{min}$(F at $SOC_{min}$) is referred to $\Delta F$.

The battery cell is preferably a lithium-ion battery cell.

In addition, a motor vehicle is made available having a battery management system of a battery, wherein the battery is connected to a drive system of the motor vehicle.

Advantageous developments of the disclosure are specified and described in the description.

BRIEF DESCRIPTION OF THE DRAWINGS

Exemplary embodiments of the disclosure are explained in more detail with reference to the drawings and the following description. In the drawings.

DETAILED DESCRIPTION

Figure 1:
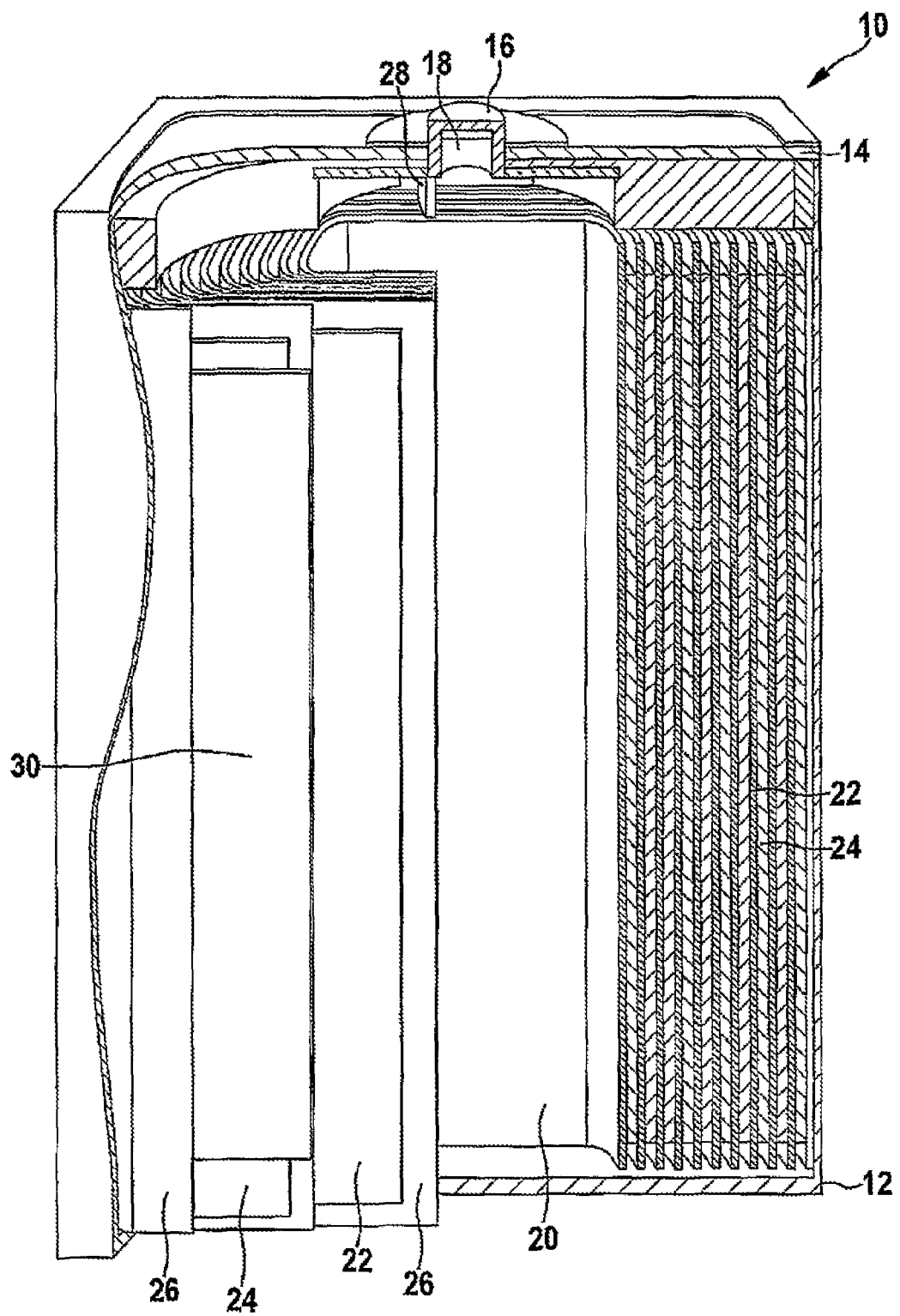
FIG. 1 shows a battery cell according to the disclosure with a pressure-sensitive film sensor for a battery management system according to the disclosure.

FIG. 1 shows a partial sectional view of a battery cell 10. The battery cell 10 comprises a metallic cell housing 12, the upper side of which is closed off by a lid 14. A negative pole 16 and an overpressure valve 18 are arranged in the region of the lid 14. In the interior of the cell housing 12 there is an electrode winding 20 which is a winding composed of an anode 22, cathode 24 and separator 26 arranged between them. The anode 22 is electrically connected to the negative pole 16 at the upper side of the electrode winding 20 via a diverter 28. The cathode 24 is connected to the metallic cell housing 12 which forms the positive pole.

A pressure-sensitive film sensor 30, in the form of a capacitive pressure sensor here, is located directly on the electrode winding 20. As illustrated here, the separator 26 is also wound around the film sensor 30. The film sensor 30 can, however, also be mounted only on the outer side of the electrode winding 20.

The attachment of the film sensor 30 can be integrated directly into the manufacturing process of the electrode winding 20 or of the battery cell 10 and therefore gives rise to a considerable cost saving. The film sensor 30 has a very small overall height and therefore does not impede the processing of the cell chemistry. Since, for example, feed lines of the film sensor 30 can also be printed on, the film sensors 30 do not, as a rule, require any additional bonding processes either. The film sensor 30 can, for example, also serve as a protective film of the electrode winding 20.

The pressure-sensitive film sensor 30 can have resistive, capacitive, piezo-resistive or piezo-electric functional elements which are produced with the aid of customary manufacturing methods. It is therefore possible, for example, to use printing, laminating or bonding methods. In order to detect well a contraction in volume and the resulting mechanical stresses between the layers of the electrode winding 20, the edge regions of the electrode winding 20 should not be evaluated and not provided with the film sensor 30.

In one embodiment, the film sensor 30 can be a capacitive film sensor. For this purpose, a full-area or patterned, flat first metallization, for example with aluminum, is applied as an electrode to a polymer carrier film. The metallization is covered by a dielectric which is made available in the form of a material which can be deformed in an elastically restorable fashion (for example polyimide). A full-area or patterned, flat second metallization is newly applied to this, wherein the electrode which is produced as a result of the metallization is arranged substantially parallel to the electrode of the first metallization. Finally, there is a following cover layer (for example a surface coating layer or polymer film as a layer for protecting against corrosion or oxidation). Changing the distance between the two electrodes causes the capacitance to change also, and on the basis of this variable it is possible to infer the prevailing pressure within the battery cell 10 or to detect a change in volume of the electrode winding.

Alternatively, the film sensor can also be configured as a piezo-electric film sensor 30. Piezo-electric films are preferably composed of polyvinylidenfluorides (PVDF), a transparent, partially crystalline thermoplast, which is polarized to produce the piezo-electric properties, that is to say heated, stretched unidimensionally and subjected to a strongly directed electromagnetic field in order to orient the dipoles. The PVDF film should be metallically coated in order to conduct away the dipole charges which occur during deformations. This metallic coating is preferably composed of gold or copper-nickel alloys. The charges can then be tapped by means of electrodes at the edge of the piezo-electric film and converted into a measurable electrical voltage by means of a charge amplifier. Energy can be supplied to the sensor using the battery voltage, for example.

The measured value which is made available by the film sensor 30 is modulated as a carrier frequency onto the connecting line of the battery (not illustrated here) via the diverter 28 and the negative pole 16. A battery management system (not illustrated here either) senses this measured value and evaluates it, inter alia, during the battery state detection in order to determine the state of charge (SOC) or state of health (SOH). The detected pressure ratios can be used, for example, during the state monitoring of the battery or the determination of lower characteristic values of the battery in the battery management system. The detection of the pressure ratios likewise permits safe recycling of the cells.

Figure 2:
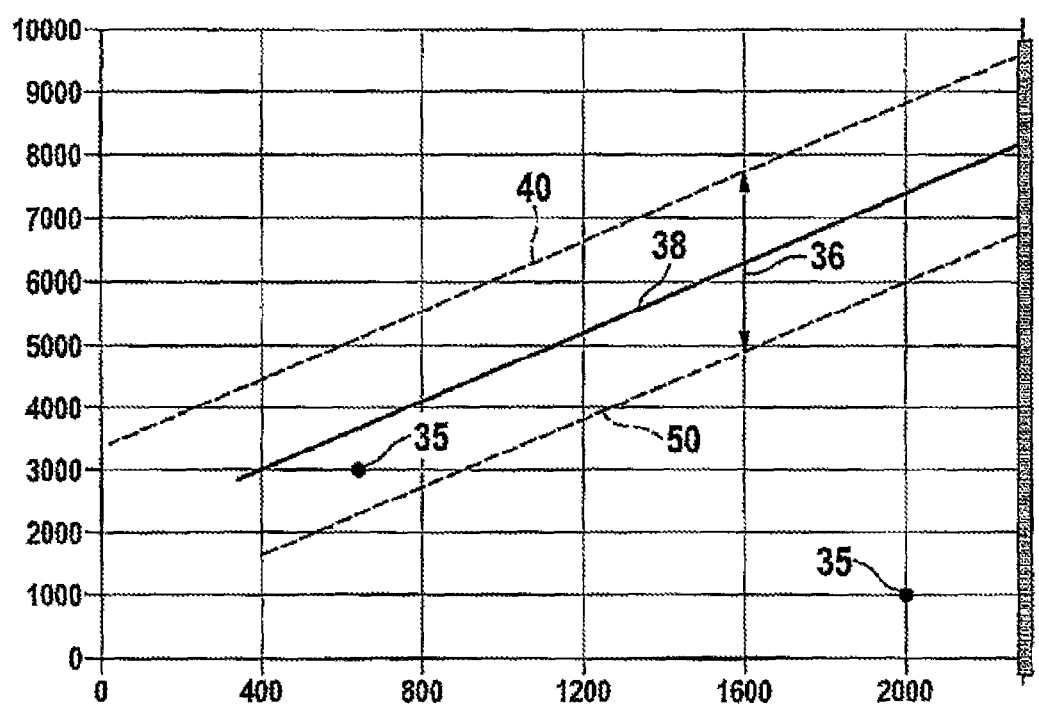
FIG. 2 shows a schematic measurement series which is stored in a battery management system according to the disclosure.

FIG. 2 is a schematic view of a measurement series which is stored in a battery management system according to the disclosure and in which measured, characteristic swelling force values F 35 are stored for each charging and discharging cycle for a battery cell type which is selected purely by way of example. In other words, in FIG. 2 the measured values which are associated with a specific charging and discharging cycle are illustrated for the swelling force F 35 of a battery cell which is not determined further in this exemplary embodiment.

In this context, values for the swelling force F are plotted in Newtons along the ordinate, while the number n of charging and discharging cycles of the battery cell is plotted on the abscissa. In this context, the maximum swelling force $F_{max,meas}$ 40 and the minimum swelling force $F_{min,meas}$ 50, which are presented as rising straight lines which run parallel to one another, form which together form a corridor in which the swelling force F which is actually measured at the battery cell whose state of health is to be determined should move in a scheduled normal operating mode of an undamaged battery cell, as a function of the respective charging/discharging cycle which the battery cell is in. In other words, the range of the abovementioned corridor is obtained for each cycle from the measured values between $F_{max,meas}$ and $F_{min,meas}$. A value which is selected purely by way of example and which can be assumed by an actual swelling force F 35 in such a normal operating mode of an undamaged battery cell in this context is shown in FIG. 2 as approximately 640 cycles, that is to say after 640 charging and discharging processes of the battery cell and a force of approximately 3000 N.

An actual swelling force F 35 which can be measured on an opened or leaking battery cell can deviate greatly from the measured values within the corridor described above. A second actual swelling force F 35 of 1000 N, which is determined purely by way of example and measured on a battery cell to be measured, is thus shown after 2000 cycles, which is far below the $F_{min,meas}$ value of 50 at 2000 cycles. Furthermore, in FIG. 2 the mean value of the swelling force $\overline{F}_{meas}$ 38 is plotted. This is obtained in the exemplary embodiment illustrated here from the rule $\overline{F}_{meas}=F_{max,meas}$ 50–½$\Delta F_{meas}$ 36, where $\Delta F_{meas}$ 36=$F_{max,meas}$ 40–$F_{min,meas}$ 50, and is shown in FIG. 2 purely by way of example for 1600 charging and discharging cycles. The profile of the measurement series for $\overline{F}_{meas}$ 38, $F_{max,meas}$ 40 and $F_{min,meas}$ 50 increases linearly plotted against the number of charging and discharging processes in this exemplary embodiment. The cause of this increase is that a force which has a calendar relationship to the age of the battery cell, that is to say a cycle-dependent force, is superimposed on the swelling force which is dependent on the respective state of charge of the battery cell. This cycle-dependent force increases slowly and irreversibly with each process of charging and discharging of the battery cell.

In this exemplary embodiment, the measurement series is illustrated purely by way of example and only in a schematic form. The measurement series which is actually stored in a battery management system according to the disclosure does not have to describe a linear profile and can deviate from that illustrated here. It is therefore possible for the profile to rise and fall locally, for example, but to increase globally. The method of calculating the mean values can also differ from that illustrated here.

What is claimed is:

1. A battery management system of a battery which has at least one battery cell including a cell housing and an electrode winding which is arranged inside the cell housing, the battery management system comprising:
    a battery state detection mechanism; and
    a pressure-sensitive film sensor positioned in contact with and covering at least certain areas of the electrode winding of the battery cell, the pressure-sensitive film sensor being configured to generate a measurement signal indicative of a pressure being applied to the pressure-sensitive film sensor by the electrode winding,
    wherein the battery state detection mechanism receives the measurement signal from the pressure-sensitive film and determines,
    a swelling force being generated by the electrode winding based on the pressure indicated by the measurement signal, and wherein the swelling force is used for a further determination of a state of charge or of a state of health.

2. A motor vehicle comprising:
a drive system;
a battery connected to the drive system, the battery including a cell housing and an electrode winding arranged inside the cell housing; and
a battery management system for the battery, the battery management system including:
a pressure sensitive film sensor positioned in contact with and covering at least certain areas of the electrode winding of the battery cell, the pressure-sensitive film sensor being configured to generate a measurement signal indicative of a pressure being applied to the pressure-sensitive film sensor by the electrode winding; and
a battery state detection mechanism operably connected to the pressure-sensitive film sensor to receive the measurement signal the battery state detection mechanism being configured to determine a swelling force being generated by the electrode winding based on the pressure indicated by the measurement signal, and determine a state of charge or a state of health of the battery based on the swelling force.

3. A battery management system of a battery which has at least one battery cell including a cell housing and an electrode winding which is arranged inside the cell housing, the battery management system comprising:
a pressure sensitive film sensor positioned in contact with and covering at least certain areas of the electrode winding of the battery cell, the pressure-sensitive film sensor being configured to generate a measurement signal indicative of a pressure being applied to the pressure-sensitive film sensor by the electrode winding; and
a battery state detection mechanism operably connected to the pressure-sensitive film sensor to receive the measurement signal the battery state detection mechanism being configured to determine a swelling force being generated by the electrode winding based on the pressure indicated by the measurement signal, and determine a state of charge or a state of health of the battery based on the swelling force.

4. The battery management system as claimed in claim 3, wherein:
the pressure-sensitive film sensor is configured to determine a maximum swelling force whenever the battery cell is completely charged from a maximum swelling of the electrode winding and a minimum swelling force whenever the battery cell is completely discharged from a minimum swelling of the electrode winding, and
the maximum swelling force and the minimum swelling force are evaluated by the battery state detection mechanism.

5. The battery management system as claimed in claim 4, wherein:
the battery state detection mechanism is configured to calculate a mean value of the swelling force from the maximum swelling force and the minimum swelling force values by subtracting one half of a change in force from the maximum swelling force, and the change in force is equal to the maximum swelling force minus the minimum swelling force.

6. The battery management system as claimed in claim 5, wherein the battery state detection mechanism is configured to compare the calculated mean value of the swelling force with measured values of a respective charging/discharging cycle, which correspond to a battery cell type and are stored in the battery management system, and to determine the state of health of the battery cell based on a result of the comparison of the calculated mean value with the measured values of the respective charging/discharging cycle.

7. The battery management system as claimed in claim 4, wherein:
the battery state detection mechanism is configured to compare at least one of the maximum swelling force, the minimum swelling force, and the change in force with a corresponding at least one of a measured maximum swelling force, a measured minimum swelling force, and a measured change in force of a respective charging/discharging cycle,
the measured maximum swelling force, the measured minimum swelling force, and the measured change in force values correspond to a battery cell type and are stored in the battery management system, and
the battery state detection mechanism is configured to determine the state of health of the battery cell based on a result of the comparison.

8. The battery management system as claimed in claim 7, wherein:
the measured maximum swelling force, the measured minimum swelling force, and the measured change in force values are stored as a linear characteristic curve extracted from measurement series for a respectively present battery cell type, and
the measured maximum swelling force, the measured minimum swelling force, and the measured change in force values are stored inside the battery management system.

9. The battery management system as claimed in claim 7, wherein:
the battery state detection mechanism is configured to detect whether a battery cell is in an opened state or is leaking based on a comparison of a measured swelling force with the measured minimum swelling force value of the respective charging/discharging cycle, and
the measured minimum swelling force value is stored in the battery management system.

10. The battery management system as claimed in claim 9, wherein the battery management system is configured to generate a warning signal when the battery cell is in the opened state or is leaking and to transmit said warning signal to a central control unit.

11. The battery management system as claimed in claim 4, wherein the battery state detection mechanism is configured to estimate the state of charge of the battery cell by dividing the swelling force minus the minimum swelling force by the maximum swelling force minus the minimum swelling force.

* * * * *

UNITED STATES PATENT AND TRADEMARK OFFICE
CERTIFICATE OF CORRECTION

| | | |
|---|---|---|
| PATENT NO. | : 9,531,039 B2 | Page 1 of 1 |
| APPLICATION NO. | : 13/904591 | |
| DATED | : December 27, 2016 | |
| INVENTOR(S) | : Heubner et al. | |

It is certified that error appears in the above-identified patent and that said Letters Patent is hereby corrected as shown below:

In Column 6, Lines 62-67, Lines 12-17 of Claim 1 should read:
wherein the battery state detection mechanism receives
    the measurement signal from the pressure-sensitive
    film and determines a swelling force being generated
    by the electrode winding based on the pressure indicated
    by the measurement signal, and Signed and Sealed this
Eighteenth Day of April, 2017

Michelle K. Lee
*Director of the United States Patent and Trademark Office*